United States Patent [19]
Palmieri et al.

[11] Patent Number: 5,306,406
[45] Date of Patent: Apr. 26, 1994

[54] METHOD AND APPARATUS FOR SPUTTERING SUPERCONDUCTING THIN FILMS OF NIOBIUM ON QUARTER-WAVE RESONANT CAVITIES OF COPPER FOR ACCELERATING HEAVY IONS

[75] Inventors: Vincenzo Palmieri, Legnaro; Renato Preciso, Piazzola Sul Brenta, both of Italy; Vladimir L. Ruzinov, Moscow, U.S.S.R.

[73] Assignee: Instituto Nazionale DiFisica Nucleare, Frascati, Italy

[21] Appl. No.: 930,197

[22] Filed: Aug. 14, 1992

[30] Foreign Application Priority Data

Aug. 14, 1991 [IT] Italy .................. RM 91A 000616

[51] Int. Cl.⁵ .................. H01L 39/24; C23C 14/34
[52] U.S. Cl. .................. 204/192.24; 204/298.02; 204/298.06; 204/298.12; 204/298.21; 505/816; 505/866

[58] Field of Search .................. 204/192.24, 298.02, 204/298.06, 298.12, 298.21; 505/1, 731, 816, 866; 427/62

[56] References Cited
PUBLICATIONS
S. A. Wolf et al., *J. Vac. Sci. Technol.*, vol. 13, No. 1, Jan./Feb. 1976, pp. 145–147.

*Primary Examiner*—Aaron Weisstuch
*Attorney, Agent, or Firm*—Robert S. Lipton

[57] ABSTRACT

A method of providing a thin film for lining quarter-wave resonant cavities of copper comprises the deposition of a superconducting material, in particular niobium, in the form of a micro-layer having a substantially constant thickness covering both the cylindrical surface of the cavity and its bottom formed of a plane plate, by biased-diode d.c. sputtering through emitting cathodes in a form fitting geometrically the surfaces to be lined.

14 Claims, 8 Drawing Sheets

METHOD AND APPARATUS FOR SPUTTERING SUPERCONDUCTING THIN FILMS OF NIOBIUM ON QUARTER-WAVE RESONANT CAVITIES OF COPPER FOR ACCELERATING HEAVY IONS

BACKGROUND OF THE INVENTION

The present invention relates to acceleration cavities for heavy ions and, more particularly, to a method and an apparatus for making the acceleration cavities superconductive at radiofrequency.

The application of superconductivity to acceleration cavities at radiofrequency allows beams of particles or heavy ions to be accelerated to otherwise unpredictable energy levels with a low power consumption. Niobium is a superconducting material which provides the greatest quality factor and allows the highest acceleration fields to be reached in an accelerating cavity due to its high critical temperature ($T_c$), its high critical field, its low resistivity under normal conditions, and its ability to resist surface oxidation.

The construction of cavities using niobium as the superconducting material, however, involves a highly sophisticated technology since the superconductivity property of niobium is strongly affected by impurities of even diminutive concentration. This is why cavities of copper are preferably made superconductive by electrodeposition of lead (electroplating), which has, however, a reduced efficiency since radiofrequency loss is proportional to the exponential of the ratio $-T_c/T$; and the $T_c$ of niobium is 9.25° K., while the $T_c$ of lead is 7.2° K. Moreover, with regard to acceleration fields, those provided by niobium are higher than those provided by lead; the critical magnetic field $H_c$ of lead is 800 gauss at 0° K. whereas that of niobium is 2000 gauss at 0° K.

Therefore, cavities for heavy ions, and in particular quarter-wave cavities or resonators (QWR) of niobium, have been provided only by electron-beam soldering of rolled sheets of niobium or composite sheets of copper and niobium produced by explosion. The results at radiofrequency confirm the absolute superiority of niobium over lead, but are heavily attendant with high cost. Moreover, the high number of electron-beam soldering required causes residual radiofrequency loss and makes the mechanical construction process more complex.

SUMMARY OF THE INVENTION

The subject invention seeks to obviate the aforementioned shortcomings by providing a method and apparatus for lining copper quarter-wave cavities with niobium at low cost while optimizing the performance of the cavities at radiofrequency. More particularly, the advantages are achieved by biased-diode d.c. sputtering of a thin film of niobium onto the inner surface of the copper resonator.

The sputtering of niobium on copper accelerating cavities for electrons is a widely proven technology: niobium cavities provided by sputtering are considerably more efficient than the corresponding niobium bulk cavities. Such a technique, however, has never been applied to acceleration cavities for heavy ions, because they have a significantly more complex geometry than acceleration cavities for electrons. That is why a less sophisticated technology, such as that of lead electrodeposition on copper, is generally accepted for quarter-wave cavities or resonator (QWR) at the cost of higher power loss, lower acceleration fields at least by a factor of 2, and a higher surface oxidation which results in stability loss.

According to the present invention, the technique of depositing superconducting films of niobium by biased-diode d.c. sputtering is extended to quarter-wave resonators of copper for heavy ions by resorting to a number of expedients which satisfactorily solve the problems involved with such technology including, for instance, the preliminary treatment of the inner surface of the cavity to be lined and the use of special equipment for sputtering niobium onto the bottom plate of the cavity and in the cavity itself using different cathodic arrangements and assuring uniform thickness of the deposited film.

In order to guarantee such results, according to the invention, a cathode having an axial symmetry is used for the sputtering within the resonator, while a plane cathode is used for the bottom plate. In both cases, the geometry of the cathode fits that of the target surface to be lined.

In the preferred embodiment, the axial symmetry cathode is a cylindrical tube having a thickness of about 2 mm. It should be noted that the diameter of such tube plays an important role for improving the uniformity of the thickness of the deposited film: a thickness uniformity of the order of 15% is provided if the diameter of the cathode is the arithmatical mean of the outer and inner diameters of the coaxial line of the quarter-wave resonant cavity on which the film is to be deposited. Another advantage of the selected arrangements is surprisingly based upon the fact that the lines of the electric field at the upper edge of the cylindrical cathode converge and are quite concentrated so that the upper surface of the resonant cavity can be lined without resorting to auxiliary devices. Accordingly, the cylindrical cathode is preferably positioned so that the distance between its upper tip and the upper surface of the cavity is equal to the radial distance between the cathode and the inner surface of the cavity.

Another problem to be solved when using the sputtering technique in QWR is suppressing the electronic bombardment of plasma at the end of the central shaft of the resonant cavity. The concentration of electrons in this region causes an excessive local heating, with the consequence of film peelage due to the different thermal expansion coefficients of copper and niobium after cooling of the cavity to room temperature.

Such a problem is solved according to the invention by inserting a steel stem at a suitable distance from the end of the central shaft, said stem being grounded and acting as a collector of electrons, thus protecting the film during sputtering.

It is noted that in this case the best results are achieved when the distance between the stem and the end of the central shaft corresponds to the radial distance between the cathode and the side surface of the cavity.

Another problem to be solved is the deposition of film in the holes of the beam transit gates. This problem is solved according to the invention by using a cylindrical magnetron of smaller diameter than the holes and by sputtering the surfaces concerned separately from the cavity.

Alternatively, a plasma formed at that portion of the cathode facing the hole which is then lined by a thermal electron emitter, for instance a thin niobium filament brought to high temperature. Another alternative is to maintain the continuity of the plasma in front of the hole by using a thin grid, still preferably of niobium, placed before said hole and grounded. In both alternatives the localized deposition of niobium may advantageously be made simultaneously with the whole cavity.

Particular attention must be paid to avoid the capture of impurities of diminutive concentrations within the film of niobium during its growth. As already mentioned, the presence of even small amounts of impurities strongly reduces both the critical temperature and resistivity ratio of niobium (the resistivity ratio is the ratio between the resistivity at 300° K. and the resistivity at 10° K. and generally corresponds to the degree of purity of niobium).

In order to solve this problem, the method of the present invention provides a bottom plate flanged to an annular substrate so as to increase the surface area to be lined, and a cathode dimensioned so as to accommodate the wider target. In this way, the impurities which would otherwise diffuse between cathode and anode are gettered by the film of niobium and do not reach the surface exposed to radiofrequency.

In the case of cavity sputtering, the gettering property of the film is utilized by flanging all of the holes of the cavity and by extending the latter with a body of the same diameter which will getter in such case any impurity which can diffuse through the open bottom of the cavity.

A further feature of the invention consists in that the cathodes do not need any cooling since the insulators of alumina or boron nitride which are provided have low degassing rates even at high temperatures under considerable cleaning conditions. Moreover, a power supply is used having a protection circuit capable of discontinuing the supply of power whenever an arc occurs. Thus, it is assured that any arc does not impair the growth of the film.

The cathode configuration is considerably simplified by the lack of cooling.

Further features and advantages of the present invention will be more readily apparent from the following description with reference to the accompanying drawings which illustrate the preferred embodiment of the invention by way of a non-limitative example.

DETAILED DESCRIPTION OF THE PREFERRED EMBODIMENT

Figure 1:
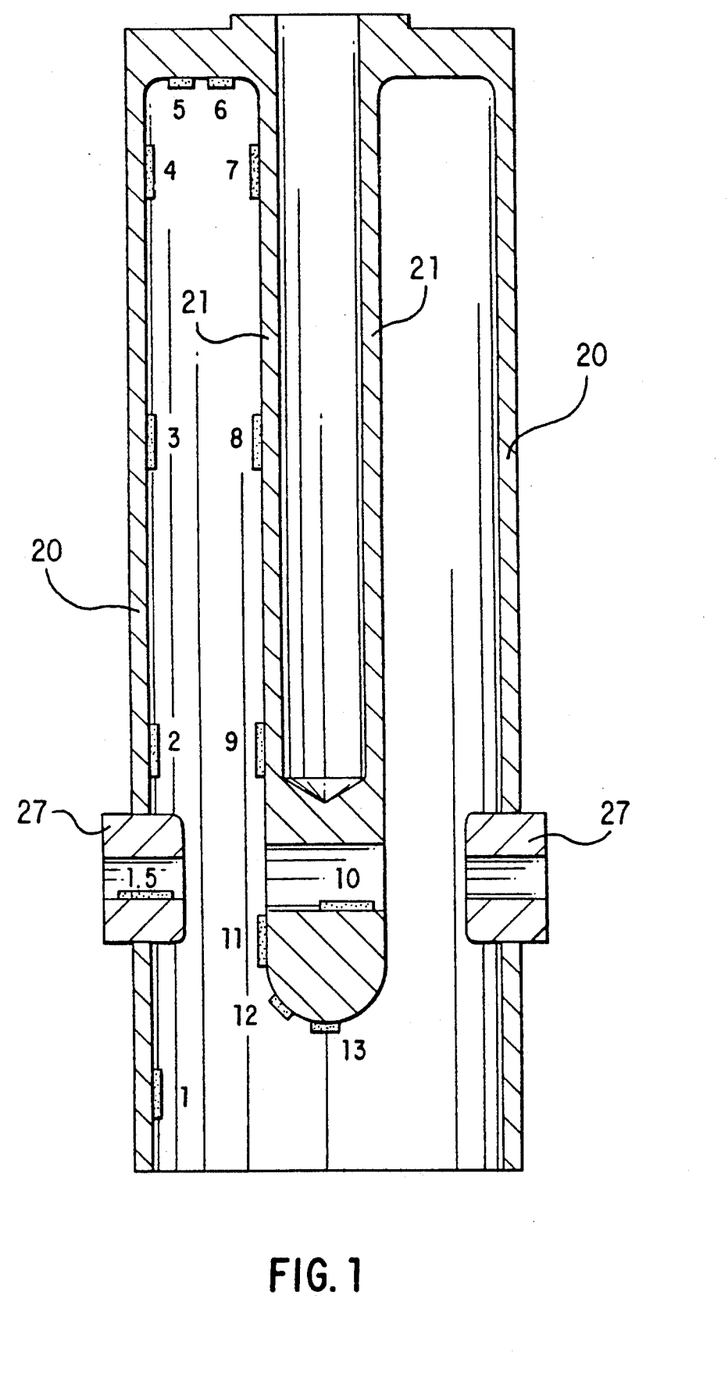
FIG. 1 is a longitudinal section of a quarter-wave resonant cavity for accelerating heavy ions.
Figure 2:
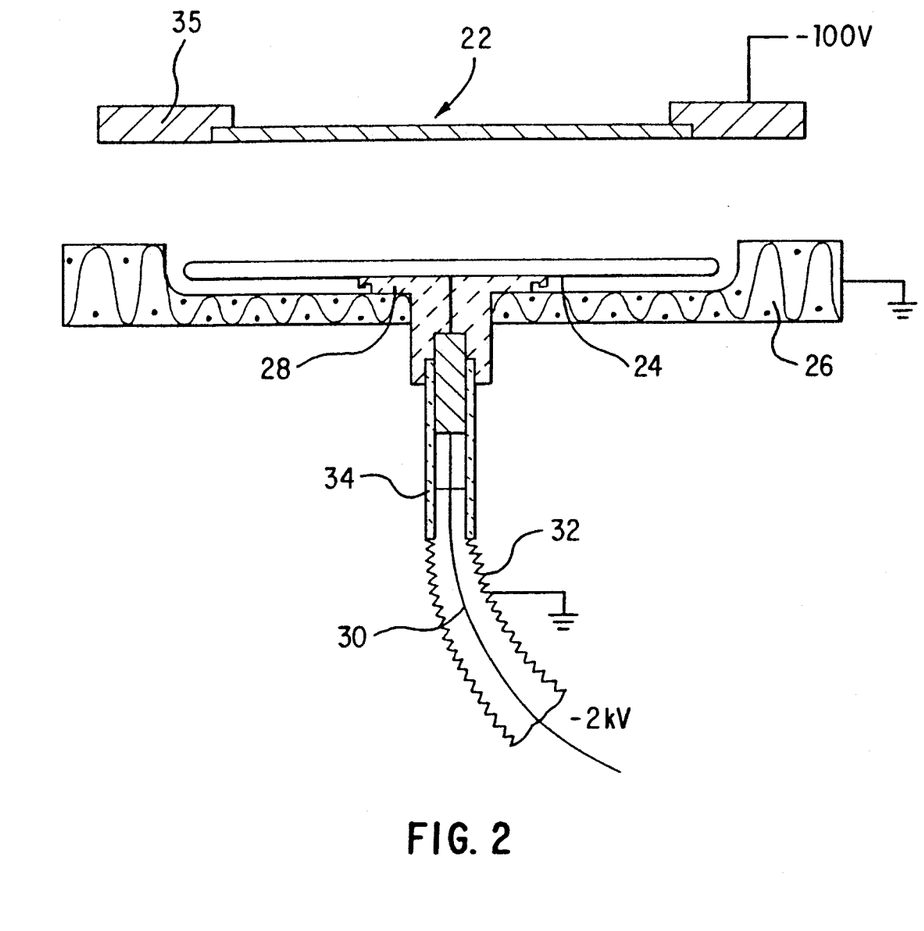
FIG. 2 shows schematically the plane cathode for sputtering the bottom of the resonant cavity.

With reference to FIGS. 1 through 4, the quarter-wave resonant cavity or resonator consists of a hollow cylindrical body 20 with a hollow central shaft 21 extending from the upper base. Body 20 is closed at the lower side by a bottom plate 22 (FIG. 2).

The method according to the subject invention provides the use of two different cathodes for lining both the surface having axial symmetry and the bottom plate 22 having plane symmetry with a superconducting film of high-purity niobium.

Figure 3:
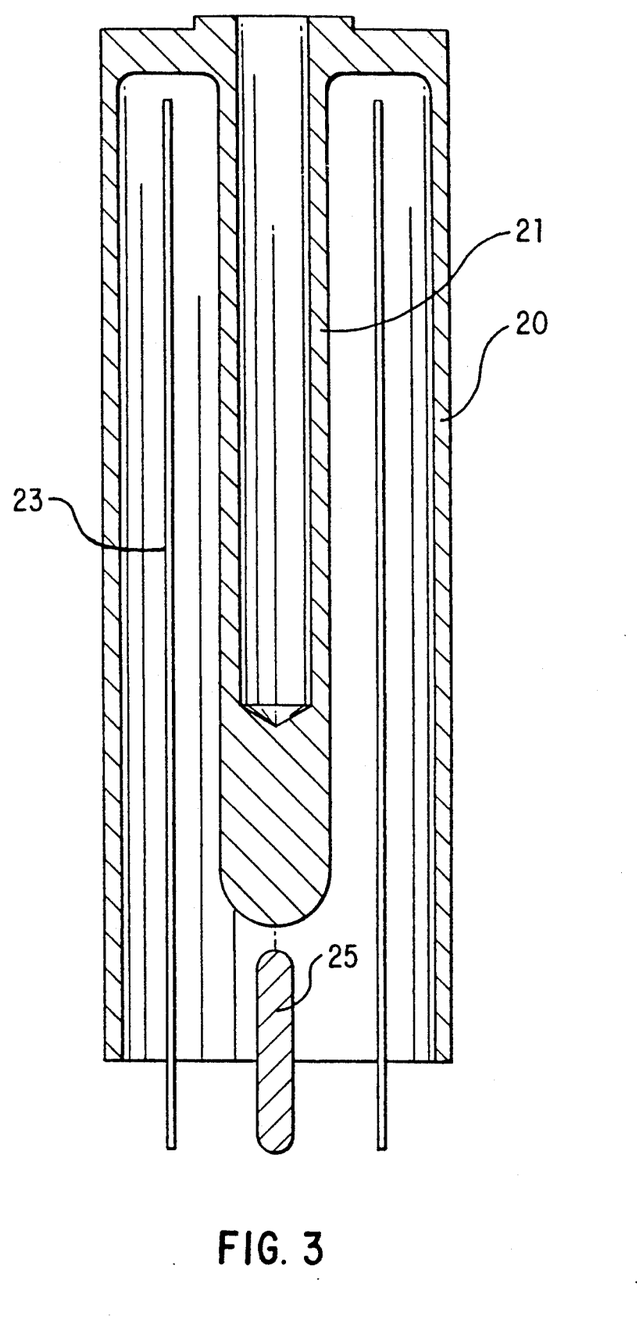
FIG. 3 is a longitudinal section of a quarter-wave resonant cavity with a cylindrical sputtering cathode inserted therein.

The cathode for sputtering inside the resonator has an axial symmetry, for example a cylindrical tube 23 shown in FIG. 3, also showing steel stem 25 acting as a collector of electrons which would otherwise damage the film at the end of shaft 21. Cathode 24 for the bottom plate 22 is planar as shown in FIG. 2, and the copper substrate cooperates with the target to prevent dust or flakes of niobium from precipitating onto the surface. Sputtering cathode 24 is a disc of high-purity niobium (RRR 200, Residual Resistivity Ratio = $R_{300° K.}/R_{10° K.}$) with a larger diameter than the bottom plate 22 which has to be lined and is flanged to the annular substrate 35.

Cathode 24 is supported by an insulating plug 28 of boron nitride, the lower end of which is fitted in a through hole of a grounded shield 26 preferably of aluminum spaced at a distance of 5 mm from cathode 24. Cable 30 for electrically supplying the cathode is shielded by a steel bellow 32 and insulators 34 of boron nitride or alumina.

Figure 5:
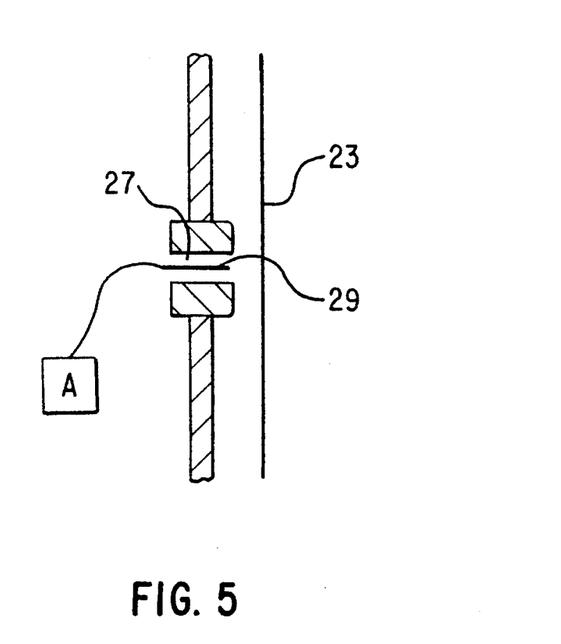
FIGS. 5 and 6 show two alternative embodiments for sputtering the holes of the beam transit gates by using a thermal emitter and a thin grid, respectively.
Figure 6:
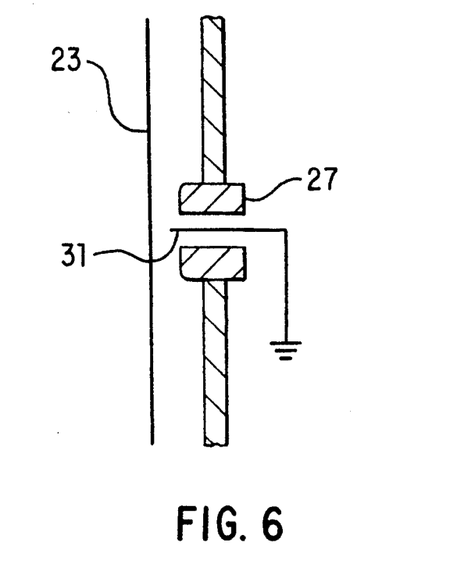

FIGS. 5 and 6 show two possible alternatives for sputtering the holes of the transit gates simultaneously with the cavity. In FIG. 5 a thermal emitter of electrons formed of a thin niobium filament 29, which is brought to high temperature by a power supply A, is inserted into the hole of the transit gate 27. In FIG. 6 a thin grid 31 of niobium connected to ground is placed before the hole of the gate facing cathode 23.

As already mentioned, the copper surface to be treated should be free from impurities and foreign matters; therefore, it is necessary that the copper cavity be subjected to a hard cleaning treatment before the sputtering.

To this end, one or more per se known methods such as tumbling, electrochemical cleaning, and chemical cleaning can be used. By way of example, a suitable treatment consists of a first tumbling phase followed by chemical cleaning and then by the introduction of the resonator into an ultrahigh vacuum chamber for a hard vacuum degassing at 300° C.

Figure 4:
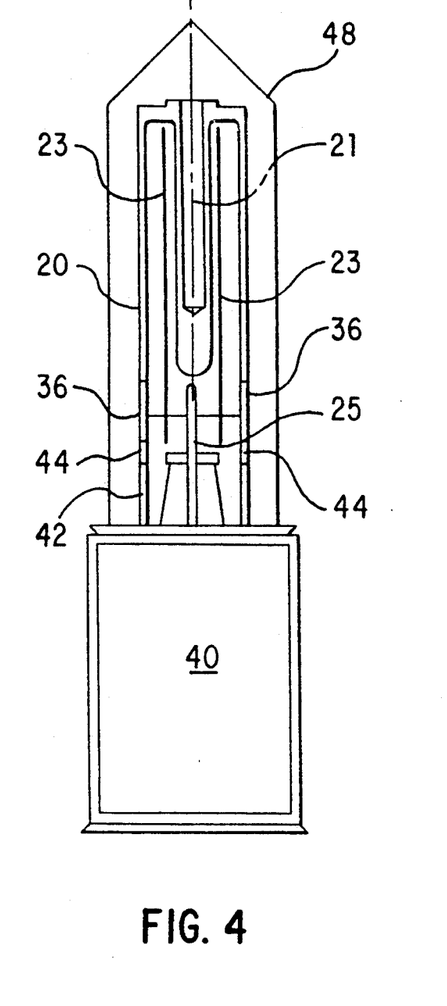
FIG. 4 is a diagram of the sputtering apparatus.

In FIG. 4 the apparatus for carrying out the method according to the invention is schematically shown. It includes a vacuum pedestal 40 with a cylindrical support 42 on which the quarter-wave cavity 20 suitably flanged to extension 36 is placed. Insulators 44 are disposed between supports 42 and extension 36. Stem 25 is located on vacuum pedestal 40 along the axis of cavity 20. The whole assembly is enclosed in an ultrahigh vacuum bell 48.

Alternatively, in case of an industrial production, the same resonant cavity may be used as the vacuum chamber by flanging it directly through extension 36 to the vacuum pumping system.

Figure 7:
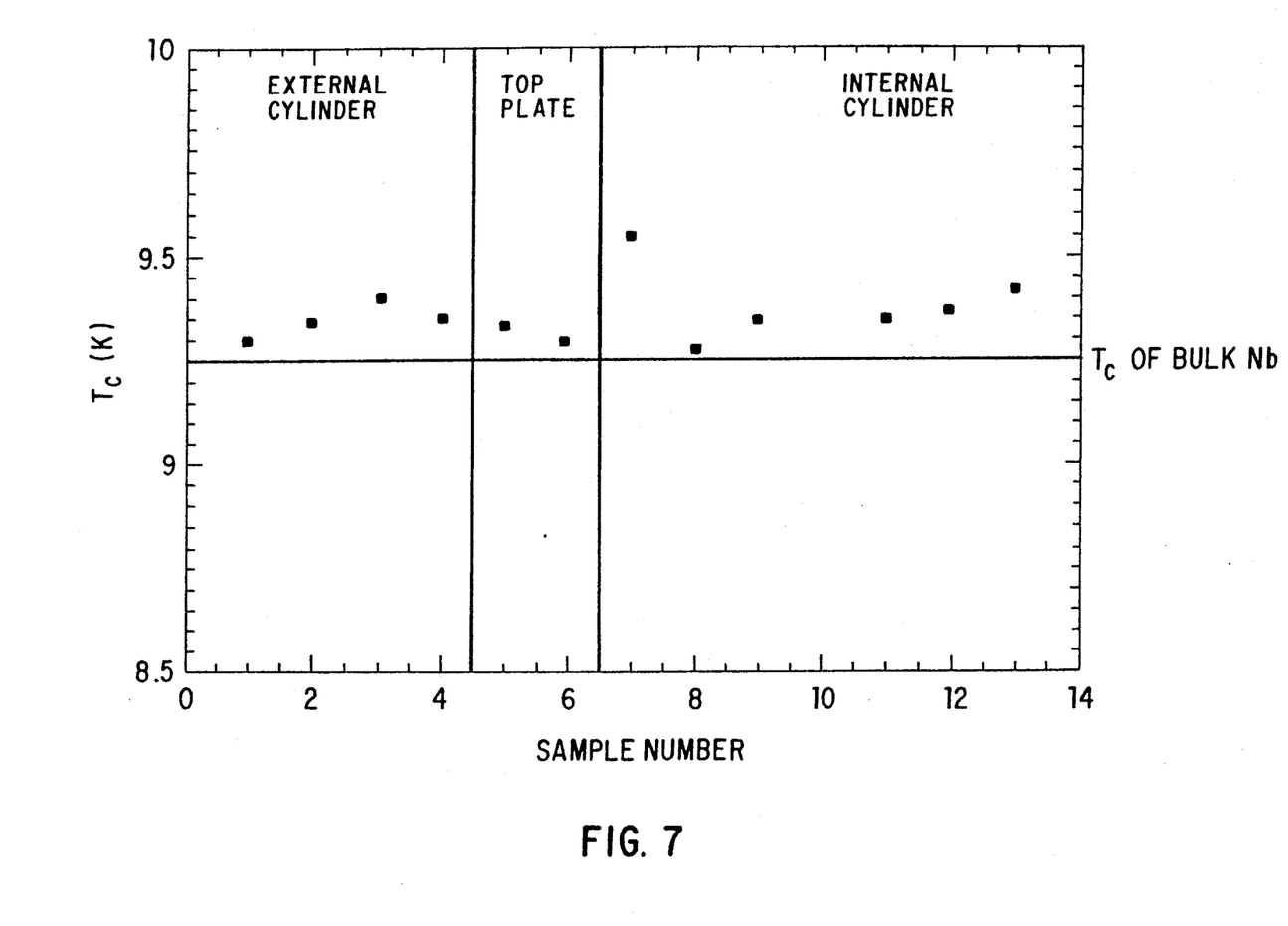
FIG. 7 is a diagram of the critical superconductivity transition temperature sampled by inserting sheets of quartz or copper into corresponding points within the cavity of FIG. 1.

FIG. 7 shows the graph of the critical superconductivity transition temperature ($T_c$) within the cavity. As is apparent from said graph, all of the values sensed in the indicated zones are greater or equal to the value of the niobium bulk ($T_c = 9.25°$ K.).

The technique of d.c. biased diode sputtering applied to the very particular geometry of the quarter-wave resonator (QWR) allows quarter-wave resonator cavities of niobium deposited on copper to be provided.

Such cavities have a number of advantages, among which are: a) their reduced cost which is significantly less than niobium bulk and exploded niobium bonded to copper cavities; b) the thermal stability of the composite system formed of centimeter thick copper substrate bonded to a few microns thick layered niobium; c) the easy regeneration of a damaged cavity due to the short time needed for stripping the film to be replaced and for the sputtering of a new niobium film.

The present invention illustrates the setup techniques for manufacturing a copper cavity sputtered with niobium. Research, and in particular during the sample examination tests, have revealed that the final radiofrequency results (Q-factor and accelerating field) depend on some technical factors which impair the quality of the results if they are neglected, namely:

1) The sputtering should be as steady as possible. Since plasma is not stabilized by a magnetic field and the niobium target is not cooled during the deposition, arcs or parasitic discharges may occur. Any current spikes damage either the cathode or niobium film, thus impairing locally both the adhesion to the substrate and the superconducting property. The suppression of any spikes may be accomplished by a) carefully cleaning the surfaces of the target and the substrate, b) using a low ripple power supply, and c) using an ultrahigh vacuum electrical insulating sleeve with minimal portions thereof under potential. In fact, one problem of the d.c. biased diode sputtering is that the plasma contacts any surface under potential, including the insulating sleeve, as the plasma is not restricted by magnetic fields.

Figure 8:
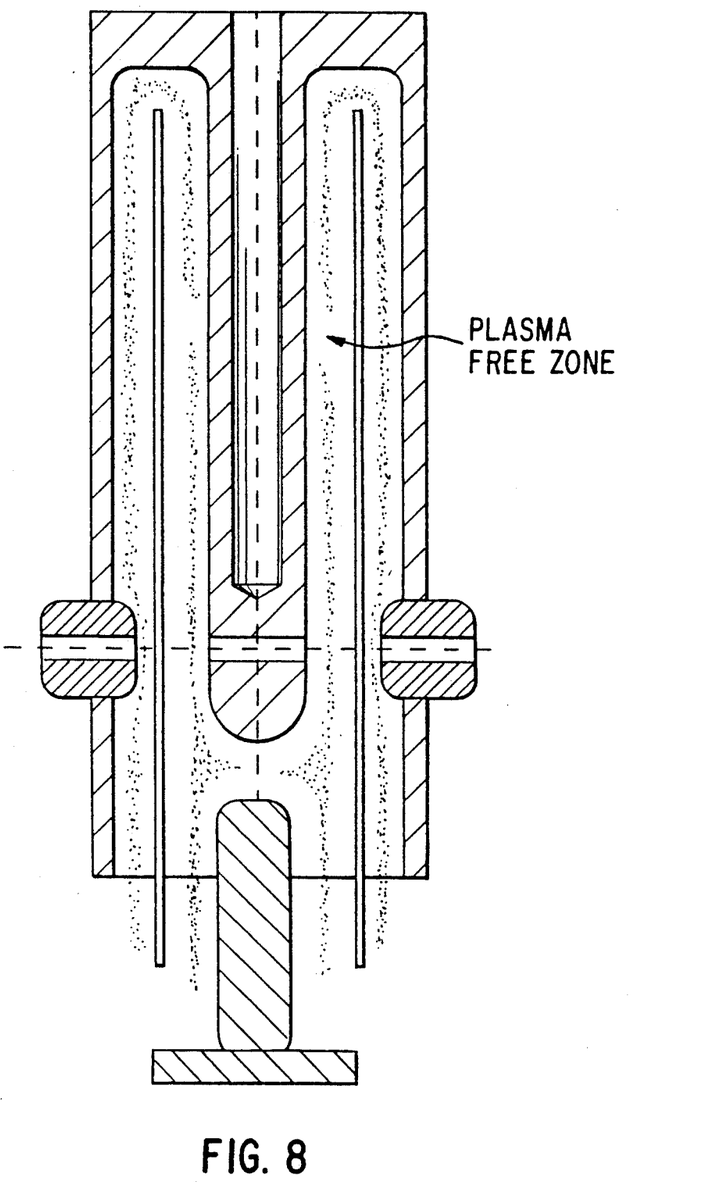
FIG. 8 shows a resonant cavity as in FIG. 1 having regions without plasma caused by an argon pressure lower than the cut-off pressure.

2) There is a cut-off level for argon operating pressure. In fact, if the pressure is below such a level, the plasma in the cavity will not be continuous, i.e. there will be an annular region within the cathode about the central shaft situated at more or less half its length in which there will be no plasma (FIG. 8). Of course, the thickness of the film in such a region will be much lower than elsewhere in the cavity and, thereby reducing superconductivity in this region.

By increasing the pressure of argon above cut-off level, the hole in the plasma is progressively closed until the optional sputtering conditions are reached. Of course, the cut-off pressure depends on the geometry of the sputtering system and above all on the distance between the inner surface of the target and the central shaft of the cavity (the lower the target diameter, the higher the operating pressure should be to suppress the hole in the plasma). For such reason the cut-off pressure has to be determined every time through the examination of the samples introduced into the cavity. During the present research it has been noted that the argon pressure of 0.2 mbar is sufficient to allow deposition to be carried out without experiencing this problem.

Figure 9A:
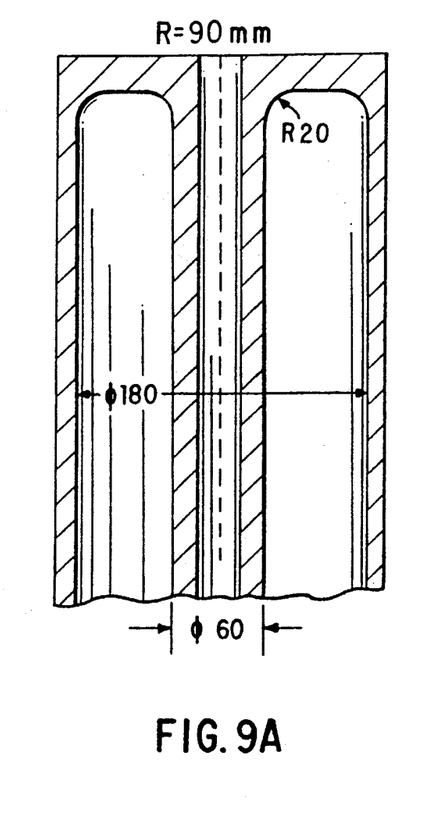
FIG. 9A shows connecting corners between short circuit plate and coaxial line having a 20 mm bending radius.
Figure 9B:
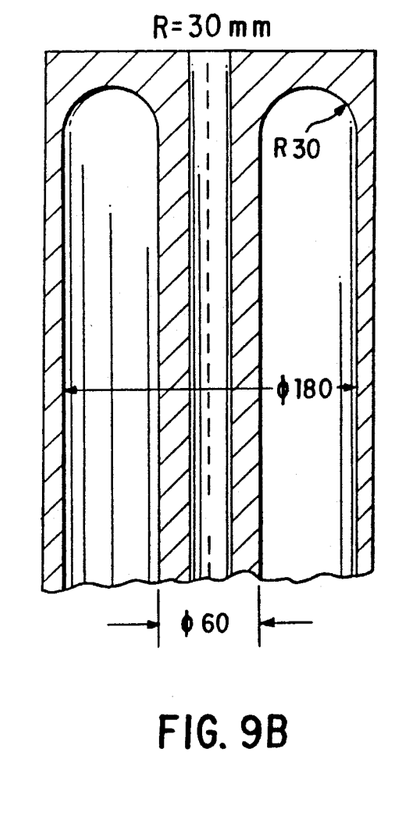
FIG. 9B shows connecting corners between short circuit plate and coaxial line having a 30 mm bending radius.

3) The bending radius of the corners between the two coaxial conductors and the short circuit plate within the copper cavity impairs considerably the final radiofrequency results in the sputtered quarter-wave resonator more than any other factor. The cathode configuration provided by the present invention is optimized so as to operate with corners as rounded as possible. (FIGS. 9A and 9B).

A copper cavity having a few millimeter bending radius of the corners will always provide an uneven thickness of niobium deposition. The film is less thick at the corners. Because the deposition rate at the corners is extremely lower than elsewhere, the film in such region is also less pure. In addition, the high density of film impurities at the corners is promoted by sharper corners which result in less active bias. According to the cathode configuration and the size of the resonator, and on the base of experimental tests, corners having a 20 mm bending radius (FIG. 9A) are not problematic. A 30 mm bending radius (FIG. 9B), however, provides the best thickness continuity as well as optimum superconducting characteristics of the deposited film (of course a 30 mm bending radius corresponds to the maximum which can be provided in a cavity as the inner shaft has a diameter of 60 mm and the outer cylinder has an inner diameter of 180 mm).

Corners having a smaller bending radius, for example 10 mm, are insufficient and result in inadequate film thickness; moreover, two opaque rings will appear at the corners connecting the central shaft and outer cylinder where the film has a brown, non-reflecting color. In this region, the RRR value is about 2, which is too low if a Q-factor higher than $2 \times 10^8$ and an accelerating field higher than 3 MV/m is to be reached (such values are obtained in cavities made by depositing lead on copper). Repeated tests have proved that the presence of such rings considerably impairs the efficiency of sputtered Nb/Cu cavities. Niobium film in such impaired regions analyzed by electron microscope has a column structure with grains of a few tens micron size separated from one another by grain boundaries about one micron large. The brown color of such film portion may be due to the size of the grain boundaries.

The ten microns size of niobium grains is due to the high temperature reached by the substrate at the end of the deposition process. As the cathode is not cooled and the sputtering is carried out under a "closed configuration," i.e. with substrate embracing completely about the cathode, the temperature of the cavity increases considerably during the deposition. Therefore, starting from a substrate temperature of 300° C., the film thickness is limited by the fact that the deposition temperature does not exceed 800° C.

Though the superconducting characteristics of the film improve with the increase of the substrate temperature, if the latter is too high there is the disk of a copper diffusion from the substrate through the grain boundaries. The presence of copper between niobium grains within the coherence distance from the surface causes residual radiofrequency losses (not depending on the temperature).

Satisfactory results have also, however, been achieved in cavities having a bending radius of 10 mm by a two-step deposition. Before the normal deposition, which is carried out according to the above-described criteria, the short circuit plate of the cavity as well as the connecting corners are covered by niobium sputtered from a niobium disc placed perpendicularly and coaxially to the cavity axis. The temperature of the cavity during the first run does not exceed 400° C. The first niobium layer probably acts as a diffusion barrier to copper diffusion or to the doping of the film by oxygen or hydrocarbons contained in the copper.

4) A further improvement of RF results can be provided by pre-sputtering the cathode. In fact, the temperature of niobium target certainly exceeds one thousand degrees just after sputtering. As soon as the discharge is extinguished, the target begins to cool. During this step the target will eject any impurity from the chamber. In the same way the impurities are absorbed onto the surface of the target whenever the latter is exposed to the atmosphere.

There are two possible solutions: a) the target is pre-sputtered by a moving cathode system in an extension flanged to the cavity and the target is then introduced into the cavity where the film deposition takes place; b) instead of 1 micron niobium a much thicker layer is deposited so that the surface of the film is as pure as possible.

5) Regarding the beam port problem, the methods outlined above may be adapted to cover the entire length of the beam port interior. Of course, the RF fields are attenuated in the beam ports so as to be zero at their ends. Obviously, the whole length of any beam port need not be perfectly superconductive since the length of the beam ports is overestimated. Nonetheless, a further solution is needed to cover the interior of the beam ports with niobium. Such solution, according to the subject invention, is based upon two considerations: there is a hole in the plasma just before the beam port which becomes more and more narrow and tends to be eliminated a) with increasing pressure, and b) with increasing distance between the cathode and wall port. It may then be possible to deposit the niobium film even in the interior of the beam ports by operating at high argon pressure (range $10^{-1}$ mbar) and by narrowing the target near the beam ports by maintaining the diameter of the target and increasing the distance between the target and beam port.

Of course, such technique means that the cavities to be sputtered have all the same dimensions.

6) The research has been carried out with the cavity placed within an ultrahigh vacuum system. This means that the provision of vacuum levels necessary for sputtering niobium is not trivial; besides it requires a long baking time. Therefore, the cavity can be directly flanged to the vacuum pump, thus reducing both the volume to be pumped and the surfaces to be degassed.

7) Even if not directly detected by the present invention, there is strong evidence to suggest that the best results can be achieved through a composite sputtering technique consisting of biased diode plus magnetron. Higher deposition rates and a greater stability of the sputtering parameters could be provided by assisting the biased-diode discharge with an outer magnetic field.

Figure 10:
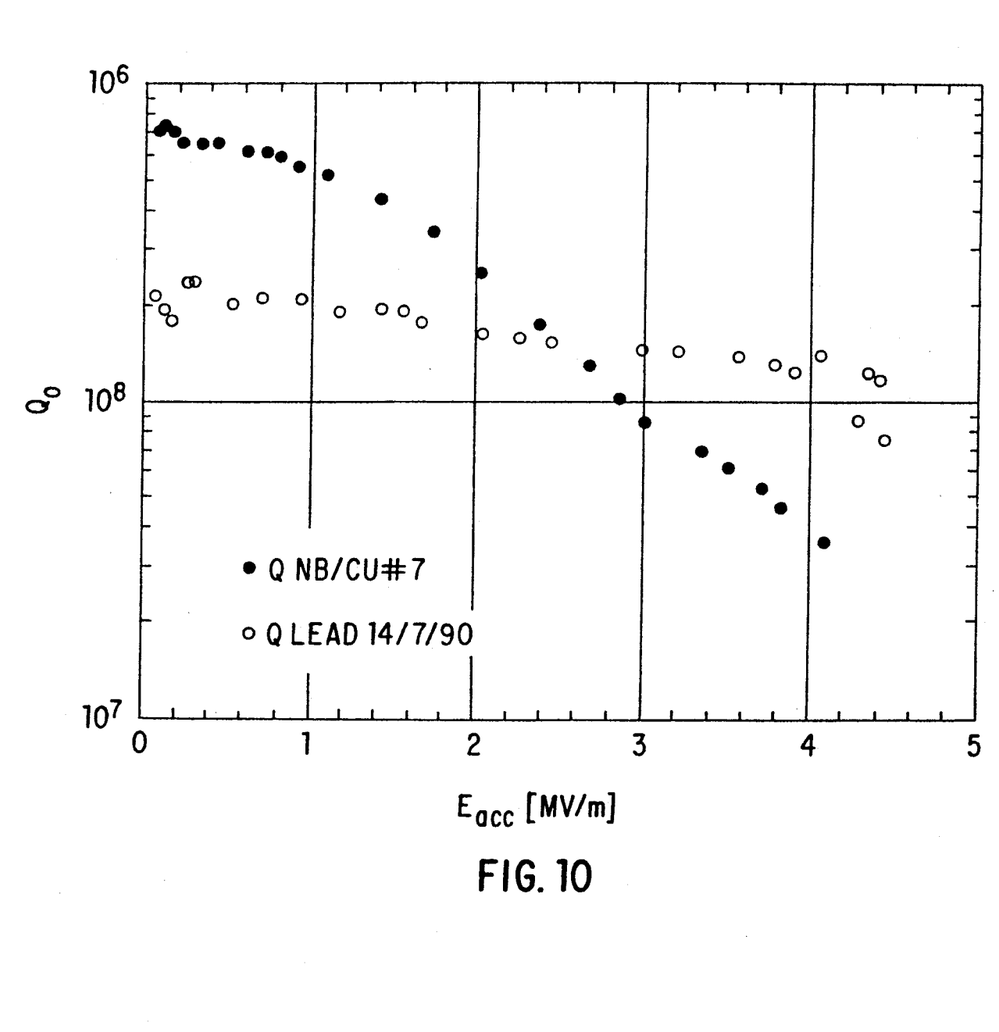
FIG. 10 is a diagram of Q-factor as a function of the acceleration field for the best cavity of sputtered niobium in comparison with the best cavity of lead electrodeposited on copper.

All of the above technical factors have provided a cavity with a low-field Qo of 7e+O8 and an acceleration field of 4 MV/m. As a comparison, the best lead cavity produced by the National Laboratories of Legnaro has a maximum Qo of 3e+O8 (FIG. 10). Notwithstanding this, since a better result is achieved each time after a radiofrequency test, the results are considered more and more interesting. The present invention has been illustrated and described with reference to a preferred embodiment thereof, but it should be understood that modifications can be made by those skilled in the art without departing from the scope of the present industrial invention.

What is claimed is:

1. A method of depositing a film of niobium superconducting material on a copper support forming a quarter-wave resonant cavity for the acceleration of heavy ions, which comprises: hard-cleaning the copper surfaces to be deposited; introducing said surfaces into an ultrahigh vacuum chamber; and biased-diode d.c. sputtering niobium onto said surfaces by means of at least one niobium emitting sputtering cathode shaped so as to fit the geometry of said surfaces.

2. The method of claim 1, wherein said at least one emitting cathode has axial symmetry, is formed of a cylindrical tube coaxially placed within the resonant cavity and has a thickness of about 2 mm.

3. The method of claim 1, wherein said at least one cathode has a diameter substantially equal to the arithmetical mean of the outer and inner diameters of the coaxial line of the quarter-wave resonant cavity on which the film is deposited.

4. The method of claim 1, wherein the step of introducing said surfaces into an ultrahigh vacuum chamber further comprises, mounting the bottom plate of the resonant cavity on an annular substrate thereby increasing the surface area to be deposited, thereby causing the peripheral area of the niobium film to remove any impurities.

5. The method of claim 1, wherein the step of diode-based d.c. sputtering further comprises, depositing on the bottom plate of the resonant cavity using a plane cathode.

6. The method of claim 1, further comprising the step of depositing a film of niobium in the holes of the beam transit gates employing a thin cylindrical magnetron of small diameter for the sputtering of said holes independent of the sputtering of the cavity.

7. The method of claim 1, further comprising the step of depositing a film of niobium in the holes of the beam transit gates using a thin niobium filament for the thermal emission of electrons.

8. The method of claim 1, further comprising the step of depositing a film of niobium in the holes of the beam transit gates using a niobium grid.

9. The method of claim 1, further comprising the step of inserting a grounded steel stem along the axis of the resonant cavity at a distance from the end of the central shaft to collect electrons thereby preventing portions of the film from peeling upon exposure to excessive heat resulting form increased electron concentration during said biased-diode d.c. sputtering.

10. The method of claim 9, wherein said distance between said steel stem and the end of said central shaft is generally equal to the radial distance between the cylindrical cathode and the side surface of the resonant cavity.

11. The method of claim 1, further comprising flanging all of the holes of the cavity and by extending the cavity with a body of the same diameter thereby removing impurities entering the open base of the cavity.

12. The method of claim 1, whereby the depositing of the upper plate of the cavity is accomplished by allowing the lines of the electric field at the edge of said cylindrical tube to converge on said upper plate of the cavity.

13. The method of claim 1, wherein said sputtering cathode is prevented from cooling.

14. An apparatus for depositing a film of niobium superconducting material on a copper support forming a quarter-wave resonant cavity for the acceleration of heavy ions, comprising in combination: a cylindrical cathode to be coaxially mounted within the resonant cavity to be lined, a plane cathode for the sputtering of the bottom plate of said resonant cavity, an annular substrate on which said bottom plate is mounted during the sputtering thereof, a vacuum pedestal provided with a supporting base connected thereto through insulator means, an extension for flanging said cavity before its assembly on said supporting base, and a steel stem located on said vacuum pedestal along the axis of said cavity for collecting electrons, produced during sputtering and a removable vacuum bell enclosing the entire assembly.

* * * * *